United States Patent
Youn

[11] Patent Number: 6,097,216
[45] Date of Patent: Aug. 1, 2000

[54] INTEGRATED BUFFER CIRCUITS HAVING IMPROVED NOISE IMMUNITY AND TTL-TO-CMOS SIGNAL CONVERSION CAPABILITY

[75] Inventor: Jae-youn Youn, Jongro-gu Seoul, Rep. of Korea

[73] Assignee: Samsung Electronics Co., Ltd., Rep. of Korea

[21] Appl. No.: 09/149,357

[22] Filed: Sep. 8, 1998

[30] Foreign Application Priority Data

Sep. 8, 1997 [KR] Rep. of Korea ............... 97-46186

[51] Int. Cl.[7] ............................................. H03K 19/175
[52] U.S. Cl. ........................... 326/71; 326/65; 326/70; 326/76; 326/83; 326/85; 326/86; 326/87
[58] Field of Search ................................ 326/71, 65, 70, 326/76, 83, 88, 86, 87

[56] References Cited

U.S. PATENT DOCUMENTS

| | | | |
|---|---|---|---|
| 4,612,461 | 9/1986 | Sood | 307/475 |
| 5,223,751 | 6/1993 | Simmons et al. | 307/475 |
| 5,304,867 | 4/1994 | Morris | 307/443 |
| 5,892,372 | 4/1999 | Ciraula et al. | 326/96 |

*Primary Examiner*—Michael Tokar
*Assistant Examiner*—Vibol Tan
*Attorney, Agent, or Firm*—Myers Bigel Sibley & Sajovec

[57] ABSTRACT

Integrated buffer circuits which are less susceptible to noise and provide TTL-to-CMOS signal conversion capability include a first TTL-compatible inversion buffer, a second CMOS-compatible inversion buffer having an input electrically coupled to an output of the first inversion buffer and a preferred pull-up (or pull-down) circuit to improve noise immunity. The preferred circuit pulls the output of the first inversion buffer to a potential of the first reference signal line (e.g., Vdd) in response to a signal at an output of the second inversion buffer and a signal at an input of the first inversion buffer. This circuit comprises a first field effect transistor having a gate electrode electrically coupled to the output of the second inversion buffer and a second field effect transistor having a gate electrode electrically coupled to the input of the first inversion buffer. These first and second field effect transistors are electrically coupled in series so that a first source/drain of the first field effect transistor is electrically connected to a first source/drain of the second field effect transistor. In addition, a second source/drain of the first field effect transistor may be electrically connected to the first reference signal line and a second source/drain of the second field effect transistor may be electrically connected to the output of the first inversion buffer.

19 Claims, 2 Drawing Sheets

US 6,097,216

INTEGRATED BUFFER CIRCUITS HAVING IMPROVED NOISE IMMUNITY AND TTL-TO-CMOS SIGNAL CONVERSION CAPABILITY

FIELD OF THE INVENTION

The present invention relates to integrated circuits and more particularly to integrated buffer circuits.

BACKGROUND OF THE INVENTION

Conventional input buffers typically convert an external off-chip signal to an internal on-chip signal. In particular, a TTL (transistor-transistor logic) input buffer used for complementary metal oxide semiconductor (CMOS) devices may perform the function of converting an external signal at a TTL-compatible level into an internal on-chip signal at a CMOS-compatible level. It is also important that this conversion function generate a stable internal signal which has reduced susceptible to noise.

Referring now to FIG. 1, an electrical schematic of an integrated buffer circuit according to the prior art is illustrated. This buffer circuit can perform the above-described function and includes a TTL inversion buffer 11 for inverting and buffering the input signal INPUT (at a TTL level) and a first inversion driver 13 for inverting and buffering the output of the TTL inversion buffer 11. This input buffer also includes a second inversion driver 15 for inverting and buffering the output signal of the first inversion driver 13 and generating an on-chip signal OUTPUT which may be provided to a high internal load. In FIG. 1, reference characters P11 and P12 indicate PMOS transistors and reference characters N11, N12 and N13 indicate NMOS transistors. As will be understood by those skilled in the art, the on-chip signal OUTPUT should be maintained at a stable CMOS-compatible level after each signal transition. To illustrate, an input buffer of a DRAM device may receive a chip enable (CE) signal at a TTL level and convert this chip enable signal to an internal signal for activating the DRAM. In particular, when the chip enable signal is changed from a logic 1 state to logic 0 state, the internal signal OUTPUT changes from a logic 0 state to a logic 1 state to thereby activate the DRAM. Unfortunately, the internal signal OUTPUT generated by the conventional input buffer of FIG. 1 may become distorted due to noise generated by the semiconductor device, as shown by the timing diagram of FIG. 2. Accordingly, the DRAM device may malfunction. Here, as illustrated, the noise may be in the power supply voltage VDD or ground voltage VSS and may be caused by bit line sensing noise or data output noise.

Thus, notwithstanding the above-described TTL-to-CMOS compatible buffer, there continues to be a need for improved buffer circuits which have greater noise immunity.

SUMMARY OF THE INVENTION

It is therefore an object of the present invention to provide improved integrated buffer circuits.

It is another object of the present invention to provide integrated buffer circuits which are compatible with TTL and CMOS signal levels.

It is still another object of the present invention to provide integrated buffer circuits having improved noise immunity.

These and other objects, advantages and features of the present invention are provided by preferred integrated buffer circuits which are less susceptible to noise and also provide TTL-to-CMOS signal conversion capability. According to one embodiment of the present invention, an integrated buffer circuit is provided which includes a first TTL-compatible inversion buffer, a second CMOS-compatible inversion buffer having an input electrically coupled to an output of the first inversion buffer and a preferred pull-up (or pull-down) circuit to improve noise immunity. The preferred circuit pulls the output of the first inversion buffer to a potential of the first reference signal line (e.g., Vdd) in response to a signal at an output of the second inversion buffer and a signal at an input of the first inversion buffer. According to a preferred aspect of the present invention, this circuit comprises a first field effect transistor having a gate electrode electrically coupled to the output of the second inversion buffer and a second field effect transistor having a gate electrode electrically coupled to the input of the first inversion buffer. These first and second field effect transistors are electrically coupled in series so that a first source/drain of the first field effect transistor is electrically connected to a first source/drain of the second field effect transistor. In addition, a second source/drain of the first field effect transistor may be electrically connected to the first reference signal line and a second source/drain of the second field effect transistor may be electrically connected to the output of the first inversion buffer. Alternatively, a second source/drain of the second field effect transistor may be electrically connected to the first reference signal line and a second source/drain of the first field effect transistor may be electrically connected to the output of the first inversion buffer.

According to another aspect of the present invention, the first and second field effect transistors comprises PMOS transistors. In the event PMOS transistors are used, a 1→0 TTL signal transition at the input of the first inversion buffer will cause a 0→1 signal transition at the input of the second inversion buffer (and turn on the second PMOS transistor) and then cause a 1→0 signal transition at the output of the second inversion buffer. The 1→0 signal transition at the output of the second inversion buffer will then be fed back to the gate of the first PMOS transistor to turn on the pull-up circuit and improve the stability and noise immunity associated with the output of the first inversion buffer by increasing the conductance of the current path between the output of the first inversion buffer and the first reference signal line (e.g., Vdd).

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete and will fully convey the scope of the invention to those skilled in the art. Like numbers refer to like elements throughout, signal lines and signals thereon may referred to by the same reference symbols and each embodiment described herein includes its complementary embodiment as well.

Figure 1:
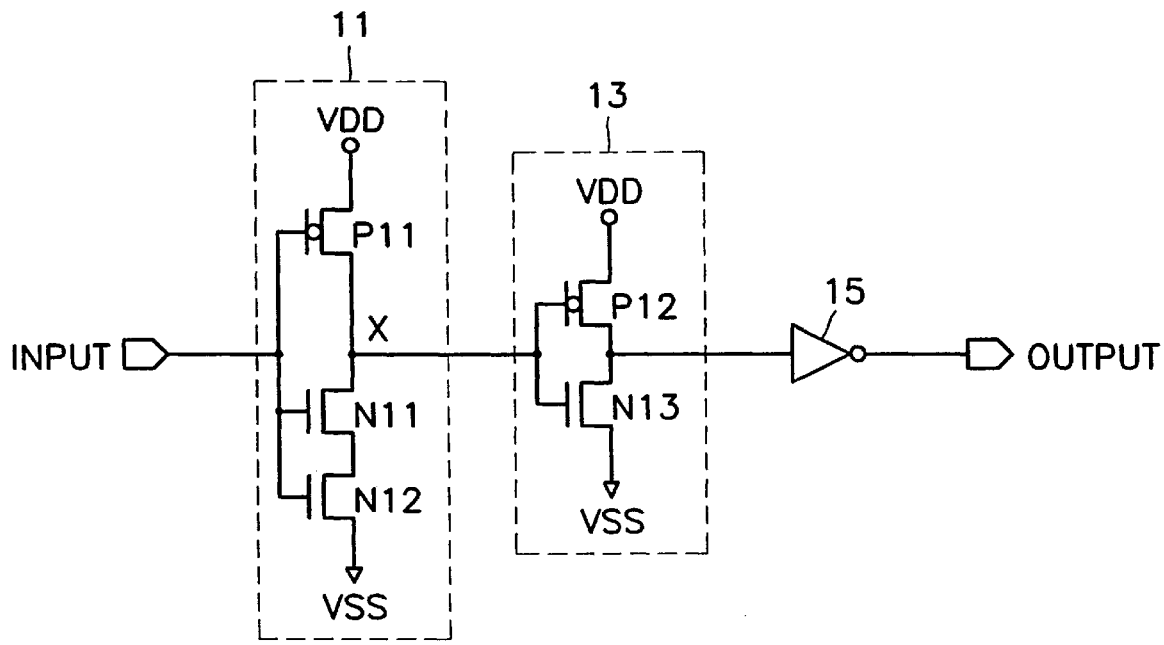
FIG. 1 is an electrical schematic of an integrated buffer circuit according to the prior art.
Figure 2:
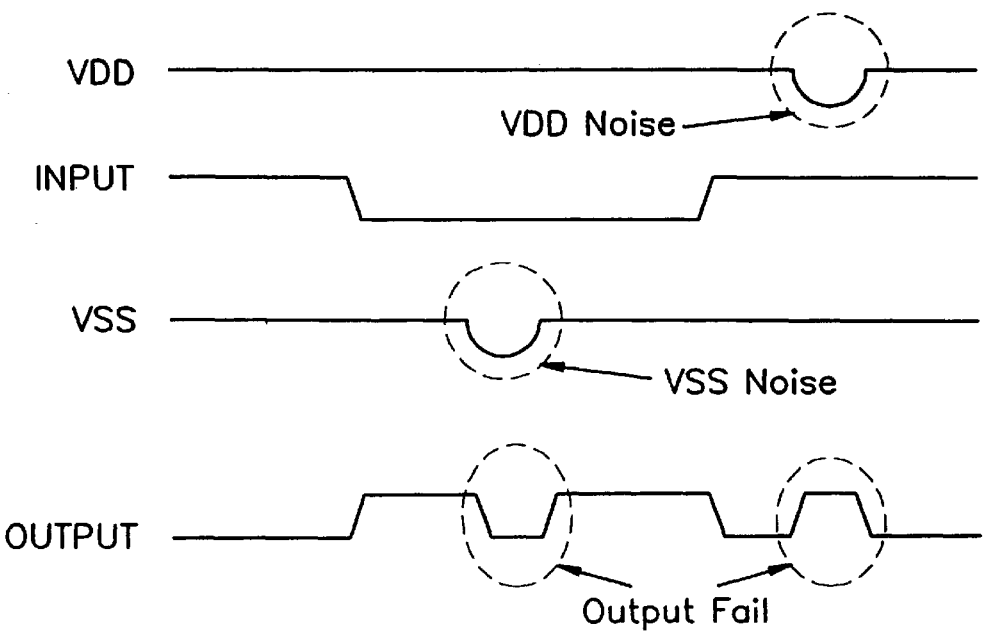
FIG. 2 is a timing diagram which illustrates the susceptibility of the buffer circuit of FIG. 1 to noise.
Figure 3:
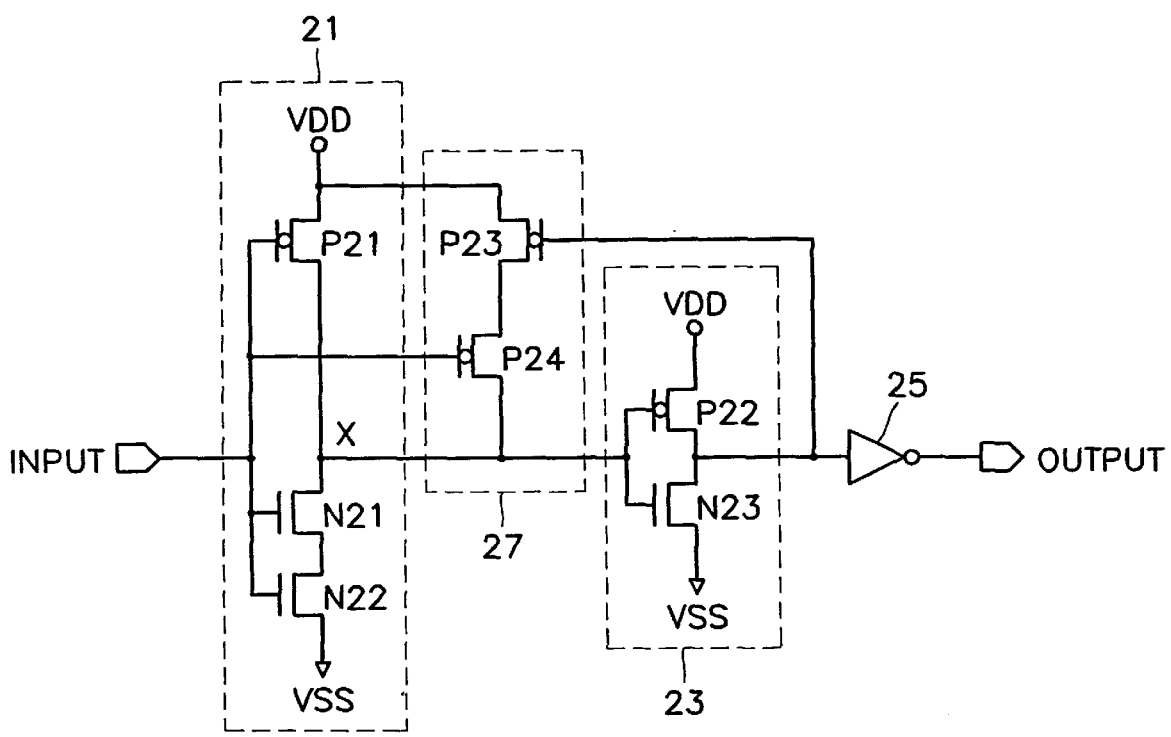
FIG. 3 is an electrical schematic of a preferred integrated buffer circuit according to an embodiment of the present invention.

Referring now to FIG. 3, an electrical schematic of a preferred integrated buffer circuit which is less susceptible to noise and also provides TTL-to-CMOS signal conversion capability, will be described. In particular, the integrated buffer circuit of FIG. 3 provides a first TTL-compatible inversion buffer 21, a second CMOS-compatible inversion buffer 23 having an input electrically coupled to an output of the first inversion buffer 21 (e.g., node X) and a preferred pull-up (or pull-down) circuit 27 to improve noise immunity. This buffer may be used as an input signal buffer which receives off-chip signals at TTL voltage levels. An inverter 25 may also be provided, as illustrated, to provide additional drive capability to a signal line (OUTPUT) which may be internal to a CMOS integrated circuit. The first TTL-compatible inversion buffer 21 may comprise a PMOS pull-up transistor P21 (W/L=60/0.52) and two serially-connected NMOS pull-down transistors N21 (W/L=10/0.48) and N22 (W/L=10/0.48), connected as illustrated. The second CMOS-compatible inversion buffer 23 may comprise a PMOS pull-up transistor P22 (W/L=30/0.52) and an NMOS pull-down transistor N23 (W/L=10/0.48), connected as illustrated.

The preferred pull-up circuit 27 pulls the output of the first inversion buffer 21 to a potential of the first reference signal line (e.g., Vdd) in response to a signal at an output of the second inversion buffer 23 and a signal (INPUT) at an input of the first inversion buffer 21. As illustrated, the pull-up circuit 27 may comprise a first PMOS field effect transistor P23 (W/L=30/0.52) having a gate electrode electrically coupled to the output of the second inversion buffer 23 and a second field effect transistor P24 (W/L=30/0.52) having a gate electrode electrically coupled to the input of the first inversion buffer 21.

These first and second PMOS field effect transistors P23 and P24 are electrically coupled in series so that a first source/drain of the first field effect transistor P23 is electrically connected to a first source/drain of the second field effect transistor P24. In addition, a second source/drain of the first field effect transistor P23 may be electrically connected to the first reference signal line (e.g., Vdd) and a second source/drain of the second field effect transistor P24 may be electrically connected to the output of the first inversion buffer 21. Alternatively, a second source/drain of the second field effect transistor P24 may be electrically connected to the first reference signal line and a second source/drain of the first field effect transistor P23 may be electrically connected to the output of the first inversion buffer 21.

In the event PMOS transistors are used in the pull-up circuit 27 as illustrated, a 1→0 TTL signal transition at the input (INPUT) of the first inversion buffer 21 will cause a 0→1 signal transition at the input of the second inversion buffer 23 (and also turn on the second PMOS transistor P24) and then cause a 1→0 signal transition at the output of the second inversion buffer 23. This 1→0 signal transition at the output of the second inversion buffer 23 will then be fed back to the gate of the first PMOS transistor P23 to turn on the pull-up circuit 27 and improve the stability and noise immunity associated with the output of the first inversion buffer 21 at node X by increasing the conductance of the current path between node X and the first reference signal line (e.g., Vdd).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated buffer circuit, comprising:
   a first inversion buffer;
   a second inversion buffer having an input electrically coupled to an output of said first inversion buffer; and
   means, electrically coupled to a first reference signal line and the output of said first inversion buffer, for pulling the output of said first inversion buffer to a potential of the first reference signal line in response to a signal at an input of said first inversion buffer and a signal at an output of said second inversion buffer.

2. The buffer circuit of claim 1, wherein said pulling means comprises a first field effect transistor having a gate electrode electrically coupled to the output of said second inversion buffer.

3. The buffer circuit of claim 1, wherein said pulling means comprises:
   a first field effect transistor having a gate electrode electrically coupled to the output of said second inversion buffer; and
   a second field effect transistor having a gate electrode electrically coupled to the input of said first inversion buffer.

4. The buffer circuit of claim 3, wherein a first source/drain of said first field effect transistor is electrically connected to a first source/drain of said second field effect transistor.

5. The buffer circuit of claim 4, wherein a second source/drain of said first field effect transistor is electrically connected to the first reference signal line; and wherein a second source/drain of said second field effect transistor is electrically connected to the output of said first inversion buffer.

6. The buffer circuit of claim 5, wherein said first field effect transistor comprises a PMOS transistor; and wherein said second field effect transistor comprises a PMOS transistor.

7. The buffer circuit of claim 6, further comprising an inverter having an input electrically coupled to the output of said second inversion buffer.

8. The buffer circuit of claim 6, wherein said second inversion buffer comprises a PMOS transistor and an NMOS transistor having respective gate electrodes electrically connected to the output of said first inversion buffer.

9. The buffer circuit of claim 8, wherein said first inversion buffer comprises a PMOS transistor and at least one NMOS transistor having respective gate electrodes electrically connected to the input thereof.

10. The buffer circuit of claim 9, wherein a width of the PMOS transistor in said first inversion buffer is about twice a width of said first field effect transistor.

11. The buffer circuit of claim 10, wherein the width of said first field effect transistor equals a width of said second field effect transistor.

12. An integrated buffer circuit, comprising:
    a first TTL-compatible inversion buffer;
    a second CMOS-compatible inversion buffer having an input electrically coupled to an output of said first inversion buffer;
    a first field effect transistor having a gate electrode electrically coupled to an output of said second inversion buffer; and
    a second field effect transistor having a gate electrode electrically coupled to an input of said first inversion buffer.

13. The buffer circuit of claim 12, wherein a first source/drain of said first field effect transistor is electrically connected to a first source/drain of said second field effect transistor.

14. The buffer circuit of claim 13, wherein a second source/drain of said first field effect transistor is electrically connected to a first reference signal line; and wherein a second source/drain of said second field effect transistor is electrically connected to the output of said first inversion buffer.

15. The buffer circuit of claim 14, wherein said first field effect transistor comprises a PMOS transistor; and wherein said second field effect transistor comprises a PMOS transistor.

16. An integrated TTL-to-CMOS signal conversion buffer, comprising:

a first inversion buffer having a first input, a first output, a first PMOS transistor electrically connected in series between the first output and a first reference signal line and first and second NMOS transistors electrically connected in series between the first output and a second reference signal line;

a second inversion buffer having a second input electrically connected to the first output, a second output, a second PMOS transistor electrically connected in series between the second output and the first reference signal line and a third NMOS transistor electrically connected in series between the second output and the second reference signal line; and a third PMOS transistor and a fourth PMOS transistor electrically connected in series between the first output and the first reference signal line, said third PMOS transistor having a gate electrode electrically connected to the first input and said fourth PMOS transistor having a gate electrode electrically connected to said second output.

17. The buffer of claim 16, further comprising an inverter having an input electrically connected to the second output.

18. The buffer of claim 16, wherein a first source/drain of said third PMOS transistor is electrically connected to a first source/drain of said fourth PMOS transistor; wherein a second source/drain of said third PMOS transistor electrically connected to the first output; and wherein a second source/drain of said fourth PMOS transistor is electrically connected to the first reference signal line.

19. The buffer of claim 16, wherein a first source/drain of said third PMOS transistor is electrically connected to a first source/drain of said fourth PMOS transistor; wherein a second source/drain of said fourth PMOS transistor electrically connected to the first output; and wherein a second source/drain of said third PMOS transistor is electrically connected to the first reference signal line.

* * * * *